US005304967A

United States Patent [19]

Hayashi

[11] Patent Number: 5,304,967

[45] Date of Patent: Apr. 19, 1994

[54] MULTI-LAYER CIRCUIT BOARD DIELECTRIC FILTER HAVING A PLURALITY OF DIELECTRIC RESONATORS

[75] Inventor: Katsuhiko Hayashi, Chiba, Japan

[73] Assignee: TDK Corporation, Tokyo, Japan

[21] Appl. No.: 927,401

[22] PCT Filed: Jan. 24, 1992

[86] PCT No.: PCT/JP92/00060

§ 371 Date: Sep. 25, 1992

§ 102(e) Date: Sep. 25, 1992

[87] PCT Pub. No.: WO92/14275

PCT Pub. Date: Aug. 20, 1992

[30] Foreign Application Priority Data

| | | | |
|---|---|---|---|
| Feb. 5, 1991 | [JP] | Japan | 3-035490 |
| Jul. 24, 1991 | [JP] | Japan | 3-207370 |
| Aug. 16, 1991 | [JP] | Japan | 3-229609 |

[51] Int. Cl.[5] ..................... H01P 1/205; H05K 3/46

[52] U.S. Cl. ..................... 333/206; 333/207

[58] Field of Search ............... 333/202, 206, 207, 222, 333/246, 235, 223; 361/412, 414

[56] References Cited

U.S. PATENT DOCUMENTS

| | | | |
|---|---|---|---|
| 4,757,288 | 7/1988 | West | 333/206 |
| 5,006,956 | 4/1991 | Kawakita et al. | 361/321 |
| 5,036,301 | 7/1991 | Takao et al. | 333/246 X |
| 5,115,373 | 5/1992 | Takeda | 333/202 |
| 5,196,813 | 3/1993 | Nakakubo | 333/206 |

FOREIGN PATENT DOCUMENTS

| | | | |
|---|---|---|---|
| 58-17651 | 2/1983 | Japan . | |
| 61-193501 | 8/1986 | Japan . | |
| 0241202 | 9/1990 | Japan | 333/202 |
| 2-137104 | 11/1990 | Japan . | |

*Primary Examiner*—Seungsook Ham

*Attorney, Agent, or Firm*—Nikaido Marmelstein Murray & Oram

[57] ABSTRACT

In a filter having a plurality of resonators (31, 32) electromagnetically coupled with each other, a multi-layer circuit board (33) is attached to one end in the longitudinal direction of the resonators (31, 32). Interstage circuit elements constituting a part of the filter components along with input and output terminals of the filter are formed in the multi-layer circuit board, and the elements of the multi-layer circuit board are connected with the resonators. The main surface of the multi-layer circuit board is located in a plane perpendicular to the longitudinal axis of the resonators so that the longitudinal length of the filter including the resonators and the multi-layer circuit board is made short. The multi-layer circuit board has trimming electrodes of the capacitors provided on the surface thereof and a coil pattern provided in the inside thereof.

11 Claims, 11 Drawing Sheets

MULTI-LAYER CIRCUIT BOARD DIELECTRIC FILTER HAVING A PLURALITY OF DIELECTRIC RESONATORS

TECHNICAL FIELD

The present invention relates to a dielectric filter used in various types of radio equipment such as portable or automobile telephones, and in other similar electronic devices.

BACKGROUND ART

High frequency filters have conventionally been used in various types of radio and other electronic equipment. Among those high frequency filters, there is a dielectric filter using dielectric resonators.

The conventional dielectric filter will be described with reference to a concrete example shown in the accompanying drawings.

First Prior-Art Example

FIGS. 7, 8, and 9A to 9C are drawings showing a first prior-art example, in which FIG. 7 is a perspective view (of the main body only) of a high frequency filter, FIG. 8 is a perspective view (of the main body and a metal case) of the high frequency filter, and FIGS. 9A to 9C show circuit examples of the high frequency filter.

In those figures, IN denotes an input terminal, OUT an output terminal, $C_0$ a coupling capacitor, 1 and 2 dielectric resonators, 3 a circuit board (interstage circuit board), 4 and 5 conductor patterns, 6 a metal case, and 7 and 8 external terminals.

As shown in FIG. 7, this dielectric filter has two dielectric resonators 1 and 2 arranged side by side, a circuit board 3 provided integrally with those resonators at one end in the longitudinal direction thereof, and a necessary circuit element mounted on the circuit board 3. For the circuit board 3, a dielectric substrate is utilized, for example, and on which conductor patterns 4 and 5 are formed by thick film printing. One end of each of above-mentioned conductor patterns 4 and 5 formed on the circuit board substrate 3 are connected respectively to the conductors of the dielectric resonators 1 and 2, and the other ends thereof are formed as the input terminal IN and the output terminal OUT, respectively. A coupling capacitor C0 as the above-mentioned circuit element, for example, is mounted between the conductor patterns 4 and 5.

In this example, the coupling capacitor $C_0$ is mounted as a discrete part, however this coupling capacitor $C_0$ may be formed utilizing the thin film patterns on the circuit board 3. The dielectric filter shown in FIG. 7 is constituted only by the main body, but this dielectric filter is usually used by being covered with a metal case 6 as shown in FIG. 8.

This metal case 6 is provided with external terminals 7 and 8, which will be connected to the input terminal IN and the output terminal OUT on the main body side, respectively. To attach the metal case 6 to the main body, the metal case 6 is moved in the arrow direction shown in FIG. 8 so that one end portion of the dielectric resonators 1 and 2 is inserted into the inside of the metal case 6. In other words, the above-mentioned insertion is done so that a part of the dielectric resonators 1 and 2 are positioned inside the metal case 6. Under this condition, the circuit board 3 is covered by the metal case 6.

The circuit construction of the above-mentioned dielectric filter is as shown in FIG. 9A. This circuit serves as a band pass filter as it is formed by connecting the coupling capacitor $C_0$ between the input terminal IN and the output terminal OUT, and a dielectric resonator 1 between the input terminal IN and the ground, and the dielectric resonator 2 between the output terminal OUT and the ground.

This high frequency filter is sometimes made as a polar band pass filter or a band rejection filter by adding some other element or elements as shown in FIGS. 9B and 9C. In the case of a polar band pass filter shown in FIG. 9B, a coil L is connected in parallel with the coupling capacitor $C_0$ as shown in FIG. 9A. In the case of a band rejection filter shown in FIG. 9C, a capacitor C1 is connected between the input terminal IN of the circuit 9A and the dielectric resonator 1, and a capacitor $C_2$ between the output terminal OUT and the dielectric resonator 2.

In order to make those dielectric filters, the coil L or the capacitors $C_1$ and $C_2$ mentioned above are mounted on the circuit board 3 shown in FIG. 7.

Other dielectric filters may be made by adding further circuit elements. In such cases, necessary circuit elements are mounted on the circuit board.

The first prior-art examples mentioned above have problems as follows:

(1) Since a circuit board on which circuit elements are mounted thereon is attached to one end in the longitudinal direction of the dielectric resonators, the length of the dielectric filter is substantially a sum of the length of the dielectric resonators and the length of the circuit board (exclusive of the metal case). A length must be secured necessary for the circuit board for mounting circuit elements. Therefore, it is difficult to reduce the size of the dielectric filter.

(2) The main body of the dielectric filter main body is used by being covered with the metal case, and therefore, the dielectric filter has to have a large volume or large external dimensions in proportion to the length of the circuit board.

(3) To make a polar band pass filter shown in FIG. 9B or a band rejection filter shown in FIG. 9C, it is necessary to add components, such as a coil L or capacitors C1 to the band pass filter in FIG. 9A. Therefore, in such dielectric filters, reductions in size and volume are much more difficult.

Second Prior-Art Example

FIGS. 10A and 10B are drawings showing a dielectric filter according to a second prior-art example, in which FIG. 10A is a circuit diagram, while FIG. 10B is a perspective view, and FIG. 11 is a plan view of an interstage circuit board.

In these figures, reference numerals 11 and 12 denote dielectric resonators, 13 an interstage circuit board, 14 an input terminal electrode, 15 and 16 terminals for mounting the resonators, 17 an output terminal electrode, 18 and 19 terminals of the dielectric resonators, and 14A, 15A, 15B, 16A, 16B, and 17A trimming electrodes.

This dielectric filter is a filter comprising dielectric resonators, and has a circuit construction shown in FIG. 10A. As shown in FIG. 10A, in this dielectric filter circuit, two dielectric resonators 11 and 12 are connected with each other through a capacitor $C_2$ (coupling capacitor), a capacitor $C_1$ is connected to the input terminal IN side, and a capacitor $C_3$ is connected to the output terminal OUT side.

If further circuit same as that in FIG. 10A is connected to the input terminal IN or the output terminal OUT in series, the capacitor $C_1$ or $C_3$ will be formed as an interstage capacitor.

As shown in FIGS. 10B and 11, this dielectric filter comprises two dielectric resonators 11 and 12 placed side by side, an interstage circuit board 13 provided integrally with those resonators at one end in the longitudinal direction the resonators, and capacitors $C_1$, $C_2$, and $C_3$ mounted on the interstage circuit board 13.

For the interstage circuit board 13, a single layer circuit board is used, on one surface of a substrate of the circuit board an input terminal electrode 14, electrodes 15 and 16 for mounting the resonators, an output terminal electrode 17, and trimming electrodes 14A, 15A, 15B, 16A, 16B, and 17A are formed in a thick film conductor pattern (printed pattern).

In this case, the input terminal electrode 14 is formed integrally with a trimming electrode 14A, the electrode 15 for mounting the resonator is formed integrally with trimming electrodes 15A and 15B, the electrode 16 for mounting the resonator is formed integrally with trimming electrodes 16A and 16B, and the output terminal electrode 17 is formed integrally with a trimming electrode 17A.

A terminal 18 of the dielectric resonator 11 is placed on the electrode 15 for mounting the resonator, a terminal 19 of the dielectric resonator 12 is placed on the electrode 16 for mounting the resonator, and then the terminals 18 and 19 are fixed to the electrodes 15 and 16 by soldering. Thus, the interstage circuit board 13 and the dielectric resonators 11 and 12 are integrated into one body.

Capacitors are formed by providing predetermined gaps (on portions devoid of the conductor) between each of the electrodes 14 to 17 formed integrally with the trimming electrodes.

More specifically, a capacitor $C_1$ is formed between the input terminal electrode 14 and the electrode 15 for mounting the resonator, a capacitor $C_2$ is formed between the electrodes 15 and 16 for mounting the resonators, and a capacitor C3 is formed between the electrode 16 for mounting the resonator and the output terminal electrode 17 (each electrode having at least one trimming electrode).

The above-mentioned capacitors $C_1$ to $C_3$ have very small capacitances, and the filter characteristics for the capacitances are very delicate, so that the capacitances are conventionally adjusted by trimming part of the trimming electrodes 14A, 15A, 15B, 16A, 16B, and 17A.

After the interstage circuit board and the dielectric resonators are put together as one body, trimming is done for adjusting capacitance, thereby adjusting the dielectric filter characteristics.

In other words, since the dielectric filter characteristics are extremely delicate, unless the characteristics are adjusted after the product is almost completed, the desired characteristics cannot be obtained. For this reason, the capacitance adjustment as described is performed.

The second prior art described above has a problem as follows.

The capacitances of the respective capacitors are adjusted by trimming process in which parts of the trimming electrodes formed on the interstage circuit board are cut away. However, since the distances between the electrodes (thick film conductor pattern) constituting the capacitors are very short, and the electrodes are very small, trimming work is made difficult. In addition, since trimming is performed after the interstage circuit board and the dielectric resonators are put together as one body, the space for trimming is very small, thus making the trimming work more difficult.

SUMMARY OF THE INVENTION

The present invention is to solve the above problem, and it is therefore an object of the present invention to provide a dielectric filter reduced in size and volume which can maintain good filter characteristics, and which is easy to manufacture.

According to the present invention, the following dielectric filters are provided:

(1) A dielectric filter having a plurality of dielectric resonators, wherein a multi-layer circuit board containing interstage circuit elements is attached to one end face of the above-mentioned dielectric resonators, and wherein the circuit elements in the multi-layer circuit board are connected with the dielectric resonators:

(2) A dielectric filter having a plurality of dielectric resonators, wherein trimming electrodes constituting capacitors are provided on one outer surface of a multi-layer circuit board containing interstage circuit elements, including capacitors, wherein electrodes for mounting the dielectric resonators are formed on the other outer surface, and wherein the dielectric resonators are mounted to the above-mentioned electrodes:

(3) A dielectric filter having a plurality of dielectric resonators, wherein a plurality of electrodes for mounting the dielectric resonators are formed on one outer surface of a multi-layer circuit board containing interstage circuit elements, including a coil and capacitors, wherein the dielectric resonators are mounted to the electrodes, wherein a coil pattern constituting the coil is formed in an inside area of the multi-layer circuit board located between the plurality of electrodes, and wherein capacitor electrode pattern constituting the capacitors is formed in the multi-layer circuit board in the laminated direction of the multi-layer circuit board so as to face the electrodes. Substrates of the multi-layer circuit board may be constituted by a low-temperature-baking material, and the dielectric constant of the circuit board substrates in the neighborhood of the coil pattern is 15 or less.

Such dielectric filters with the above-discussed characteristics have the following functions and advantages:

(A) A band pass filter can be provided, for example, by forming only an interstage coupling capacitor in the multi-layer circuit board attached on one end face of the dielectric resonators. A polar band pass filter can be also provided by forming an interstage coupling capacitor and a coil in the multi-layer circuit board. Further, a band rejection filter can be provided by forming another capacitor in the multi-layer circuit board in addition to the interstage coupling capacitor.

In this case, circuit elements (capacitor, coil) used in combination with the dielectric resonators are all formed in a thick film pattern within the multi-layer circuit board. Therefore, even if the number of circuit elements increases, they can be contained in the multi-layer circuit board without making any changes in its external dimensions. This makes it possible to reduce the size and the volume of various types of dielectric filters.

Particularly, the advantages of the above-mentioned reductions in size and volume (lightweight) becomes more conspicuous when a dielectric filter is formed in a multi-stage structure of three or greater stages.

(B) The elements as constituting parts of the inter-stage circuit of the dielectric filter are set inside the multi-layer circuit board. Therefore, there is greater freedom in setting capacitances for capacitors than in the prior-art examples in which a single layer circuit board is used.

Because the capacitance of capacitors can be easily adjusted according to the present invention, it is possible to maintain excellent filter characteristics, and the manufacture of such dielectric filters becomes easier.

BRIEF DESCRIPTION OF THE DRAWINGS

FIGS. 2A and 2B are perspective views of a dielectric filter according to a second embodiment of the present invention, in which FIG. 2A shows a view from a trimming electrode side, and FIG. 2B shows a view from a side on which dielectric resonators are mounted;

FIGS. 4A and 4B are views showing the interstage circuit board in FIGS. 2A, 2B, and 3, in which FIG. 4A is a view from a reverse side of a second layer 43-2 shown in FIG. 3, and FIG. 4B is a sectional view taken along a line X-Y of FIG. 2A;

FIGS. 5A and 5B show a dielectric filter, in which FIG. 5A is a perspective view of the dielectric filter, and FIG. 5B is a circuit diagram for schematically explaining the circuit construction of the dielectric filter;

FIGS. 10A and 10B show a dielectric filter as a second prior-art example, in which FIG. 10A is a circuit diagram, and FIG. 10B is a perspective view.

BEST MODES FOR CARRYING OUT THE INVENTION

Embodiments of the present invention will be described with reference to the accompanying drawings.

Description of a First Embodiment

A first embodiment achieves the object of the present invention by using a multi-layer circuit board for an interstage circuit board of a dielectric filter having two dielectric resonators.

Figure 1:
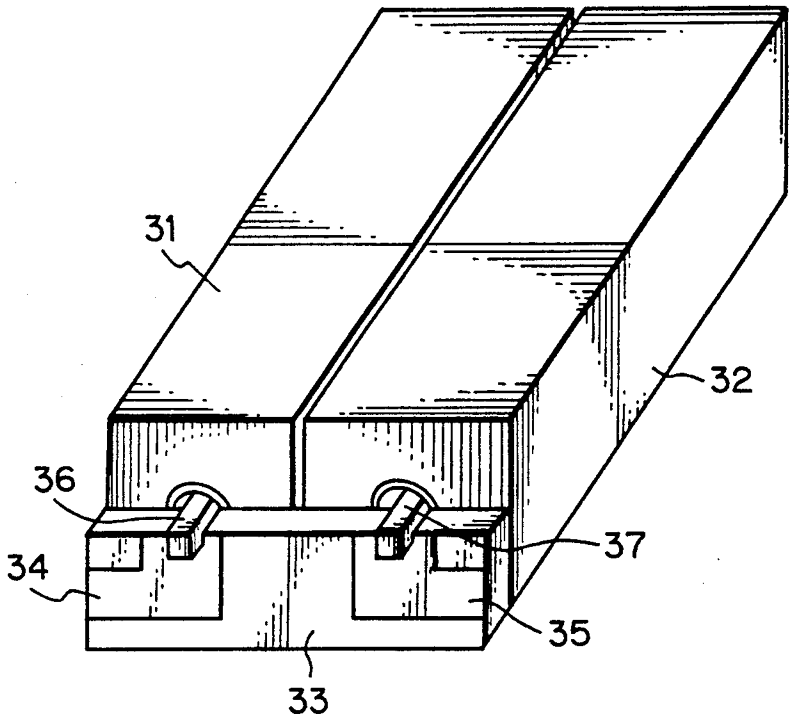
FIG. 1 is a perspective view of a dielectric filter according to a first embodiment of the present invention.

FIG. 1 shows a perspective view of the dielectric filter according to a first embodiment of the present invention. In FIG. 1, reference numerals 31 and 32 denote dielectric resonators, 33 a multi-layer circuit board (interstage circuit board), 34 and 35 conductor patterns constituting electrodes for mounting the dielectric resonators, and 36 and 37 clip-shaped terminals.

The dielectric filter of this embodiment is provided with a ceramic multi-layer circuit board for the circuit board (interstage circuit board) which is used to mount circuit elements (discrete parts, for example) in the prior-art, and also provided with other circuit elements within this ceramic multi-layer circuit board.

Each of the resonators includes a strip of internal conductor and a dielectric member with a length of about ¼ of a signal wavelength, which surrounds the internal conductor. One end of the internal conductor is shorted to a external conductor, while the other end is an open end, without being shorted to the external conductor. The resonators are ¼ wavelength resonators each of which is structured by a ¼ wavelength line with one shorted end. The multi-layer circuit board is mounted at the open end of the resonators.

As shown in FIG. 1, in the dielectric filter according to this embodiment, two dielectric resonators 31 and 32 are arranged such that they contact with each other at one side face thereof. A multi-layer circuit board 33 as an interstage circuit board is mounted on one end face in the longitudinal direction of the dielectric resonators 31 and 32. It is important that the main surface of the multi-layer circuit board faces to one end face in the longitudinal direction of the dielectric resonators 31 and 32, causing the dielectric filter to be reduced in length.

In the multi-layer circuit board 33, circuit elements (coil, capacitor, for example) different from the dielectric resonators 31 and 32 are formed by using a thick film pattern (thick film printed pattern).

The multi-layer circuit board 33 is coupled to the dielectric resonators 31 and 32 by means of the clip-shaped terminal 36 and 37. Namely, the terminals 36 and 37 partly inserted into the dielectric resonators 31 and 32 are formed with clip-shaped ends beforehand, and then the multi-layer circuit board 33 is held by the clip-shaped terminals 36 and 37 and fixed by soldering. In this case, conductor patterns (electrodes for mounting dielectric resonators) 34 and 35, connected to the internal circuit of the circuit board 33, are formed beforehand. The conductor patterns 34 and 35 are caught by the clip-shaped terminals 36 and 37, and fixedly connected with each other by soldering.

Thus, the circuit in the multi-layer circuit board 33 is electrically connected with the two dielectric resonators 31 and 32, and simultaneously the dielectric resonators 31 and 32 are fixed mechanically to the multi-layer circuit board 33. If a metal case is used to cover the filter, external terminals on the metal case are electrically connected with the conductor patterns 34 and 35 formed on the surface of the multi-layer circuit board 33.

The length of the dielectric filter is determined by the length of the dielectric resonators 31 and 32, and the thickness of the multi-layer circuit board 33 (when the metal case is not provided). The thickness of the multi-layer circuit board 33 can be made extremely thin, with the result that the total length of the dielectric filter can be made substantially shorter than in the prior-art examples. This makes it possible to decrease the size and the volume of the dielectric filter, and its manufacture becomes easier.

The conductors formed in the multi-layer circuit board 33 or on the outer surface of the multi-layer circuit board should preferably be made by a low-resistance material, such metals as Au, Ag, Pd, Pt, and Cu or alloys of these metals, for example, Ag-Pd. The conductors can be formed by applying a paste made from a powder of conductor metal by adding a glass frit and a solvent to the surface of the circuit board and then baking the circuit board. For the substrate of the multi-layer circuit board, a ceramic crystallized glass or the like can be used. To enable simultaneous baking with the conductor material such as Ag, as mentioned, a low-temperature-baking ceramic material should preferably be used which can be baked at a temperature of 1000° C. or below. For the substrate material, it is desirable to use a composite structural material (glass ceramic) composed of glass and a ceramic aggregate such as $Al_2O_3$ described later.

The above-mentioned first embodiment can be modified as described below:

(1) The connection of the dielectric resonators 31 and 32 with the multi-layer circuit board 33 may also be achieved by just soldering the terminals (electrodes) inserted into the dielectric resonators 31 and 32 to the electrodes formed on the outer surface of the multi-layer circuit board 33.

Figure 9A:
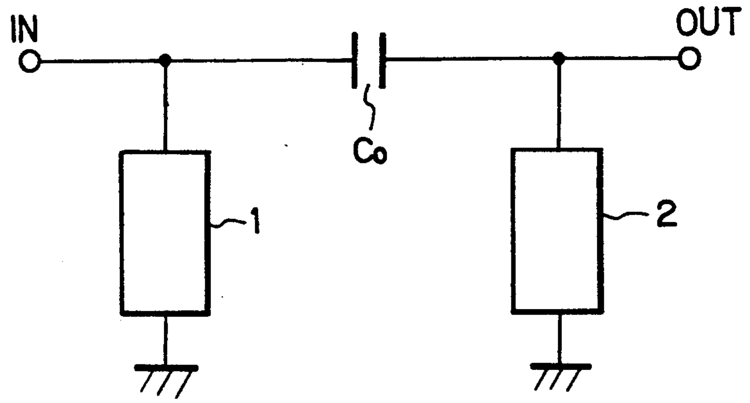
Fig. 9A PRIOR ART
FIGS. 9A to 9C are circuit examples of the dielectric filter of the first prior-art example.
Figure 9B:
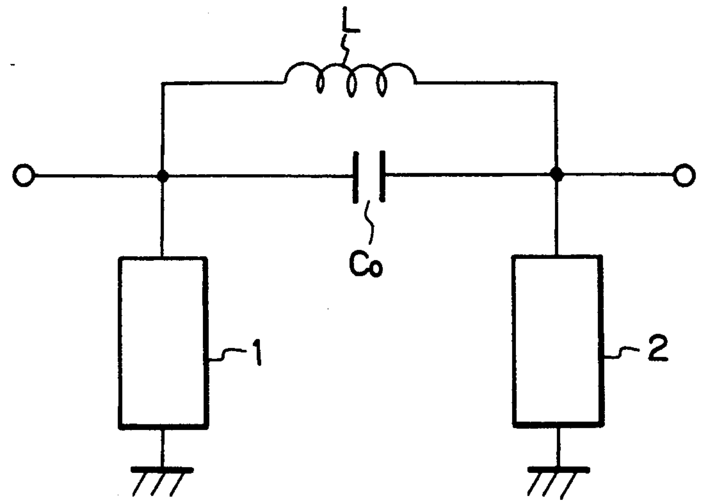
Fig. 9B PRIOR ART
Figure 9C:
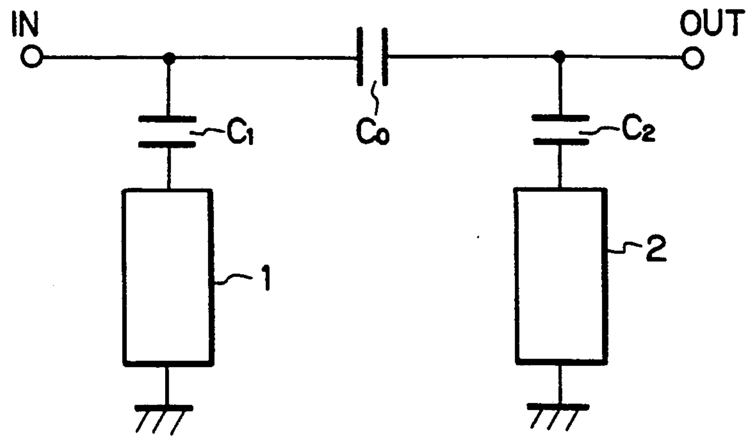
Fig. 9C PRIOR ART

(2) The circuit elements contained within the multi-layer circuit board 33 include a coupling capacitor $C_o$, a coil L, and capacitors $C_1$ and $C_2$ shown in FIGS. 9A to 9B. However, according to the present invention, the circuit elements are not limited to those mentioned above, but may include more coils or capacitors, and other circuit elements.

(3) A plurality of the dielectric filters shown in the above-mentioned embodiment may be connected to form a filter in a multi-stage structure.

(4) This dielectric filter can be used not only as an independent component but in a diplexer or the like. (5) When used with a metal case, the dielectric filter is so structured that the external terminals on the metal case are connected with the conductor pattern formed on the outer surface of the multi-layer circuit board.

Description of a Second Embodiment

A second embodiment is a case in which a multi-layer circuit board is used for an interstage circuit board of a dielectric filter using two dielectric resonators, and also in which trimming work can be made easy for capacitance adjustment of the capacitors contained in the multi-layer circuit board.

Figure 10A:
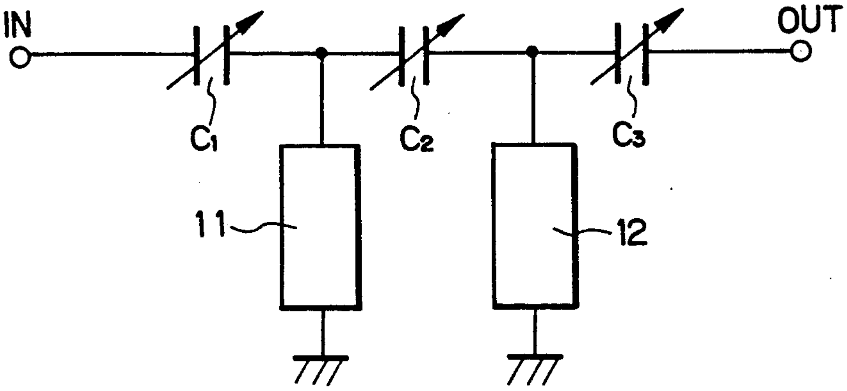
Fig. 10A PRIOR ART
Figure 10B:
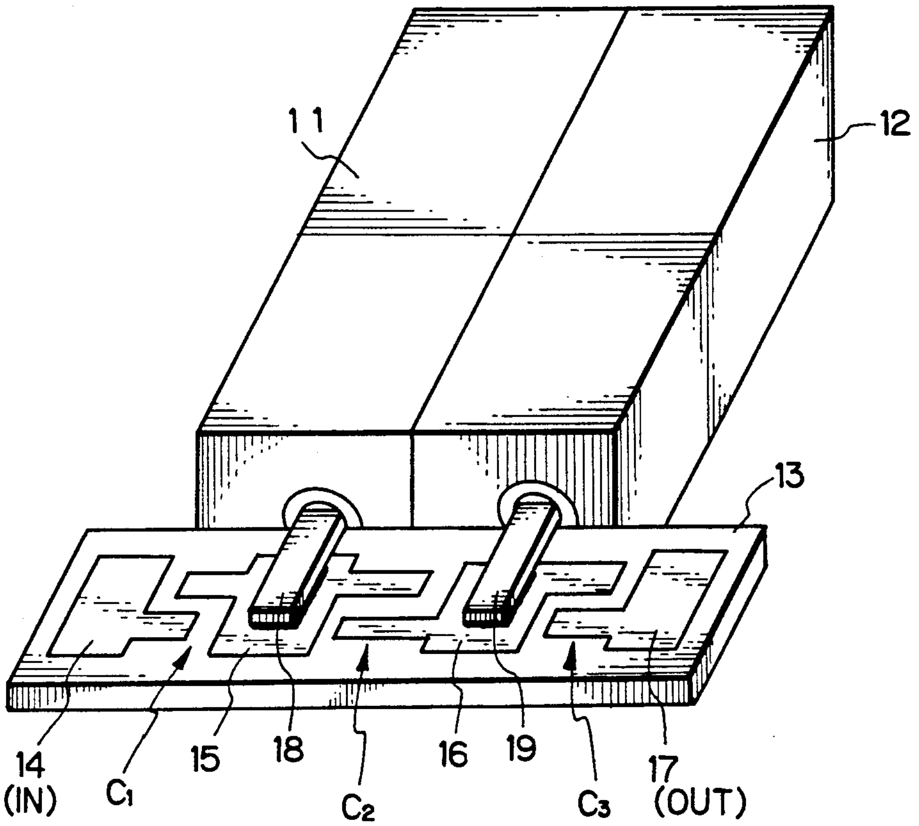
Fig. 10B PRIOR ART
Figure 11:
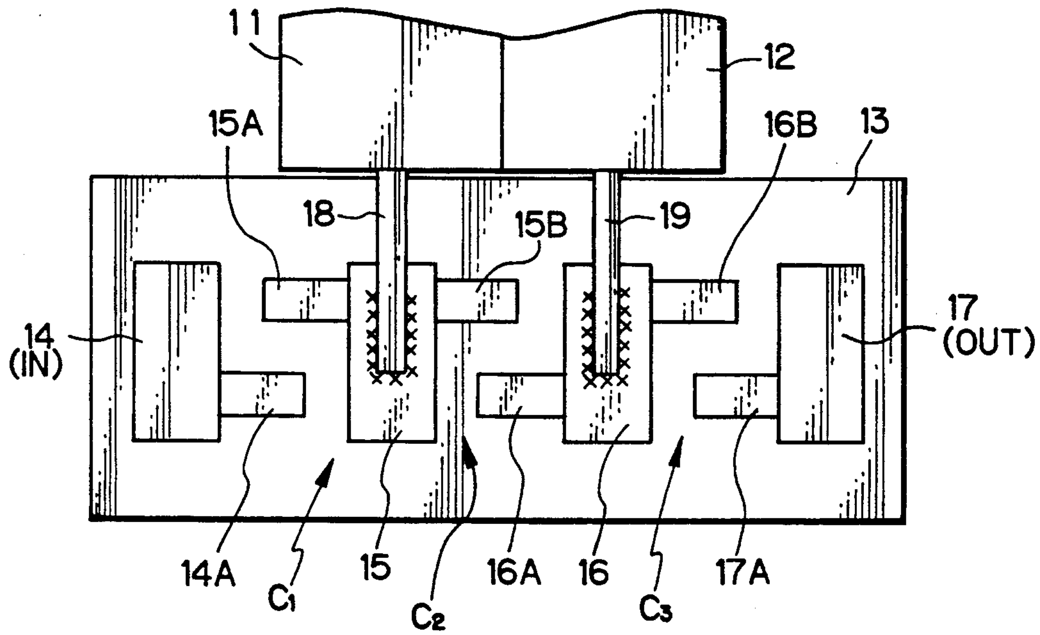
Fig. 11 PRIOR ART
FIG. 11 is a plan view of an interstage circuit board of the dielectric filter shown in FIGS. 10A and 10B.

The circuit configuration of the dielectric filter according the second embodiment is the same as that of the second prior-art example shown in FIG. 10A.

Figure 2A:
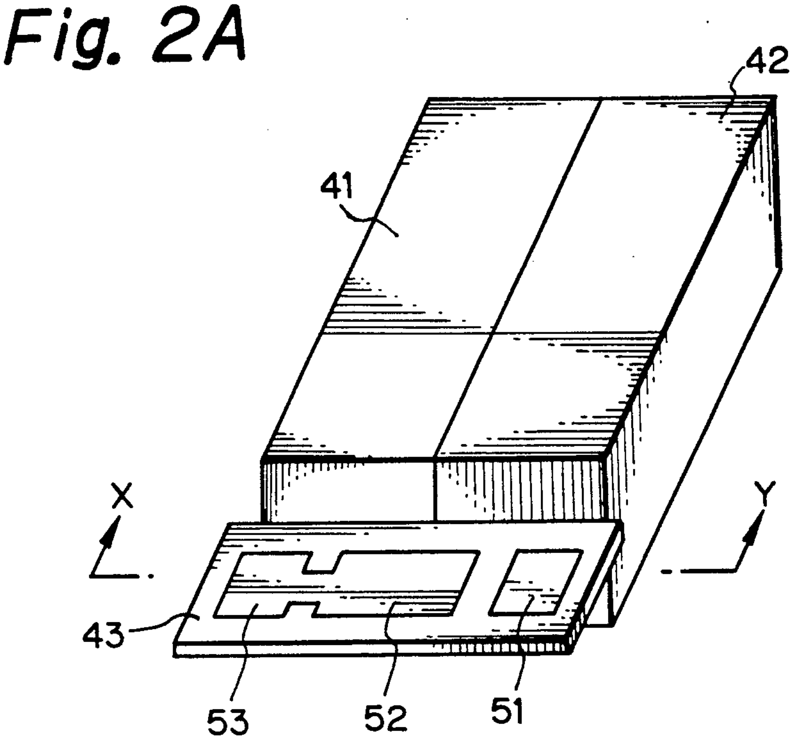
Figure 2B:
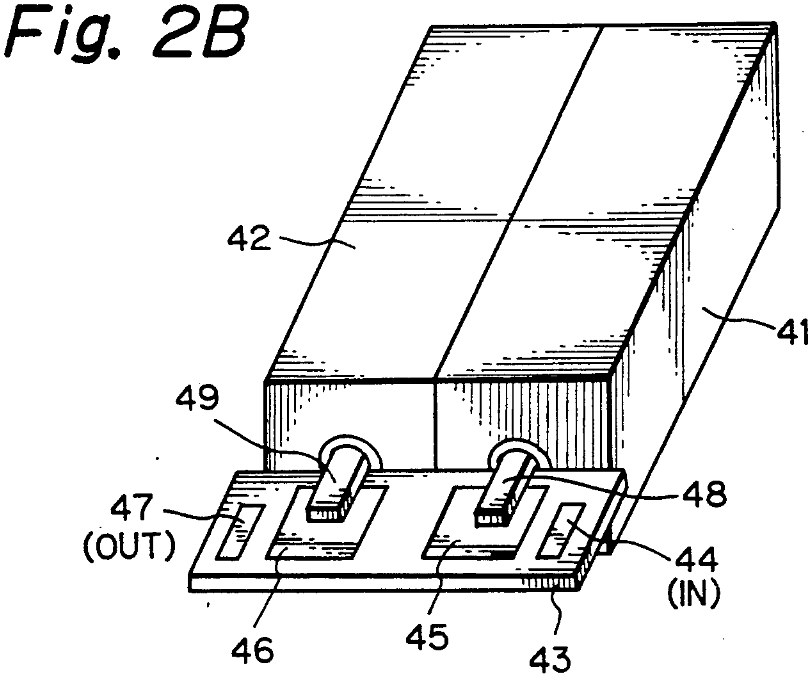
Figure 3:
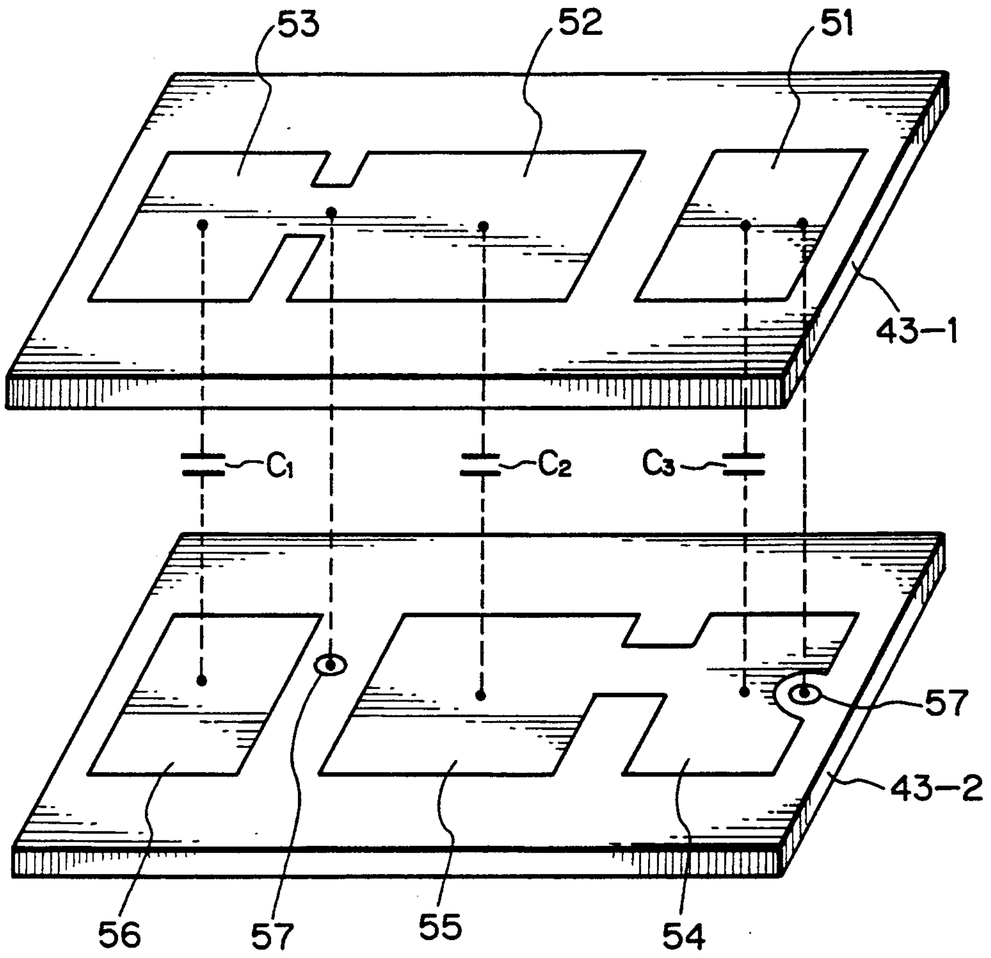
FIG. 3 is an exploded view in perspective of an interstage circuit board of the dielectric filter shown in FIGS. 2A and 2B.
Figure 4A:
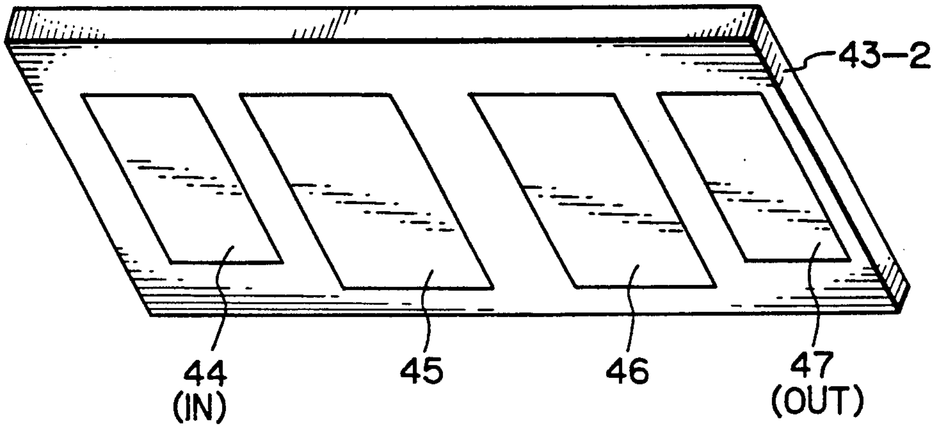
Figure 4B:
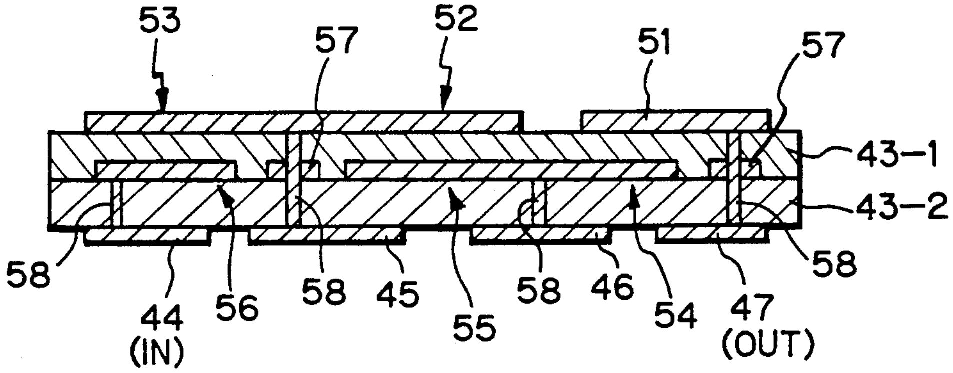

FIGS. 2A, 2B, 3, 4A and 4B show the second embodiment of the present invention, in which FIG. 2A is a perspective view from a trimming electrode side, FIG. 2B is a perspective view from a side on which dielectric resonators are mounted, FIG. 3 is an exploded view in perspective of an interstage circuit board, FIG. 4A is a reverse side of the second layer, and FIG. 4B is a sectional view taken along a line X-Y of FIG. 2A. In those Figures, reference numerals 41 and 42 denote dielectric resonators, 43 an interstage circuit board (multi-layer circuit board), 44 an input terminal electrode, 45 and 46 electrodes for mounting the resonators, 47 an output terminal electrode, 48 and 49 terminals of the dielectric resonators, 51 to 53 trimming electrodes, 54 to 56 capacitor electrodes, 57 through-holes, 58 blind through-holes (filled with a conductor), 43-1 a first layer of the interstage circuit board, and 43-1 a second layer of the interstage circuit board.

The interstage circuit board 43 is constituted by a multi-layer circuit board (two-layer), and trimming electrodes 51, 52, and 53 are formed in a thick film pattern on the first layer 43-1 thereof. The trimming electrodes 52 and 53 are formed in one linked-pattern.

On the second layer 43-2 of the interstage circuit board (multi-layer circuit board), the capacitor electrodes 54, 55, and 56 are formed in a thick film conductor pattern, and also the through-holes 57 are formed. The capacitor electrodes 54 and 55 are formed in one linked-pattern.

The positions of the trimming electrodes 51, 52, and 53 correspond to the positions of the capacitor electrodes 54, 55, and 56, respectively. The electrodes 45 and 46 for mounting the resonators, the input terminal electrode 44, and the output terminal electrode 47 in a thick film conductor pattern are formed on the reverse surface of the second layer 43-2.

The trimming electrode 51 and the output terminal electrode 47 are connected with each other by the blind through-hole (filled with a conductor) 58 via the through-hole electrode 57, as indicated by a dotted line in FIG. 3.

The capacitor electrode 56 and the input terminal electrode 44 are connected with each other by the blind through-hole 58, and the trimming electrode 52 (actually, the joint portion between the electrodes 52 and 53) and the electrode 45 for mounting the resonator are also connected with each other by the blind through-hole 58 via the through-hole electrode 57, as indicated by a dotted line in FIG. 3.

Furthermore, the capacitor electrode 55 (integral with the capacitor electrode 54) and the electrode 46 for mounting the resonator are connected with each other by the blind through-hole 58. Also, the trimming electrode 51 is connected to the output electrode 47 by the through-hole 58 via the through-hole electrode 57.

According to the above-mentioned structure, connections are made between the trimming electrode 51 and the output terminal electrode 47, between the capacitor electrodes 54 and 55, and the electrode 46 for mounting the resonator, between the trimming electrodes 52 and 53, and the electrode 45 for mounting the resonator, and between the capacitor electrode 56 and the input terminal electrode 44. Furthermore, a capacitor $C_1$ is formed between the trimming electrode 53 and the capacitor electrode 56, a capacitor $C_2$ is formed between the trimming electrode 52 and the capacitor electrode 55, and a capacitor $C_3$ is formed between the trimming electrode 51 and the capacitor electrode 54.

The thus formed capacitors are contained in the multi-layer circuit board. However, the trimming electrodes 51 to 53 constituting the electrodes on one side of the capacitors are on the outer surface of the multi-layer circuit board.

The terminals 48 and 49 of the dielectric resonators 41 and 42 are placed on and soldered to the above-mentioned electrodes 45 and 46 for mounting the resonators. By mounting the terminals 48 and 49 as described, the dielectric resonators 41 and 42 are integrated with the interstage circuit board 43. After the mounting the resonators 41 and 42, trimming for the capacitance adjustment of the capacitors is carried out.

The above-mentioned trimming is done by cutting part of the trimming electrodes 51, 52, and 53 exposed at the surface of the multi-layer circuit board 43. In this case, since the trimming electrodes 51 to 53 are provided on the surface opposite the surface on which the resonators have been mounted, there is a wide enough space for trimming, so that trimming work can be done easily.

The above-mentioned second embodiment can be modified in the manner described below.

(1) The number of dielectric resonators used may be two as in the above-mentioned embodiment, or may be any larger number more than two.

(2) The number of layers of the multi-layer circuit board is not limited to two, but may be any number more than two.

(3) The dielectric filter according to the second embodiment can be used for the diplexer. In other words, an interstage circuit of a transmitting-side dielectric filter and an interstage circuit of a receiving-side dielectric filter can be integrated to one body.

(4) As for devices to be connected to the dielectric resonators, not only capacitors but also capacitors and a coil can be used. For example, in addition to the circuit shown in FIG. 10A, a coil may be connected in parallel with the capacitor $C_2$ to form a polar band pass filter. In this case, this coil may be a discrete component and soldered to the electrodes for mounting the resonators, or may be formed in a thick film conductor pattern on the surface of the circuit board or contained in the multi-layer circuit board (formed in a thick film conductor pattern).

(5) Without using the capacitors $C_1$ and $C_2$ of the second embodiment mentioned above, a dielectric filter (band pass filter) may be formed by the capacitor $C_2$ and the dielectric resonators 41 and 42.

(6) It is possible to make a dielectric filter (a band rejection filter, for example) by modifying arbitrarily the circuit of the capacitors $C_1$ to $C_3$ in the second embodiment.

(7) The trimming electrodes may be formed in any shape.

(8) Similar to the first embodiment, it is possible that the main surface of the multi-layer circuit board faces to one end face in the longitudinal direction of the above-mentioned dielectric resonators, causing the length of the dielectric filter to be reduced.

According to the second embodiment described above, the following additional advantages can be obtained.

(A) Since the trimming electrodes of the capacitors and the electrodes for mounting the resonators are provided on separate surfaces of the interstage circuit board, respectively, a sufficient space can be secured for trimming work. Therefore, this wide available space facilitates the trimming work for adjustment of the capacitances. In addition, the interstage circuit board can be reduced in size while securing the above-mentioned trimming space.

(B) In contrast to a single-layer board, the multi-layer board according to the present invention can expose only one electrode of each of the capacitors to be trimmed on the surface, so that even if the trimming electrodes are small, the trimming work can be done easily. Also, the interstage circuit board in multi-layer the structure provides greater freedom in setting the capacitances of the capacitors than in the case of a single-layer interstage circuit board. As a result, the trimming electrodes can be easily miniaturized.

(C) Since the trimming work for capacitance adjustment of the capacitors is made easy, the productivity improvement and the cost reduction of dielectric filters become possible.

Description of a Third Embodiment

Figure 5A:
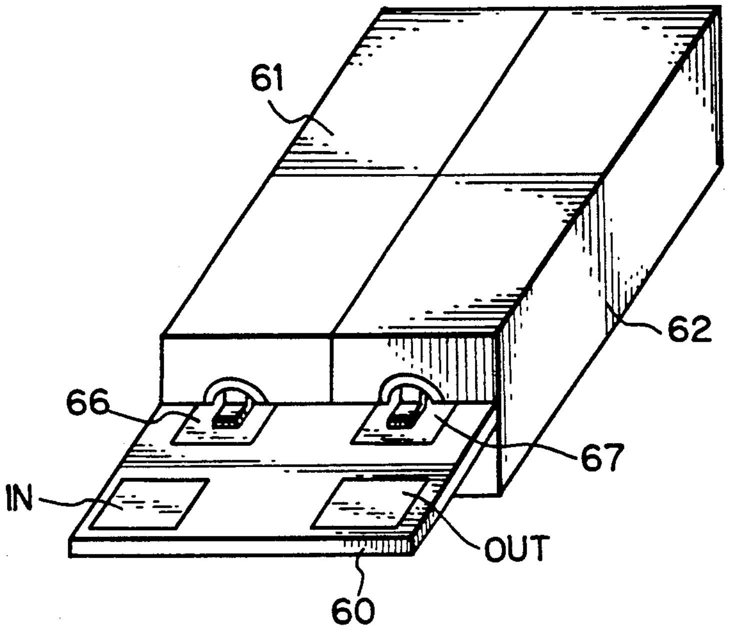
Figure 5B:
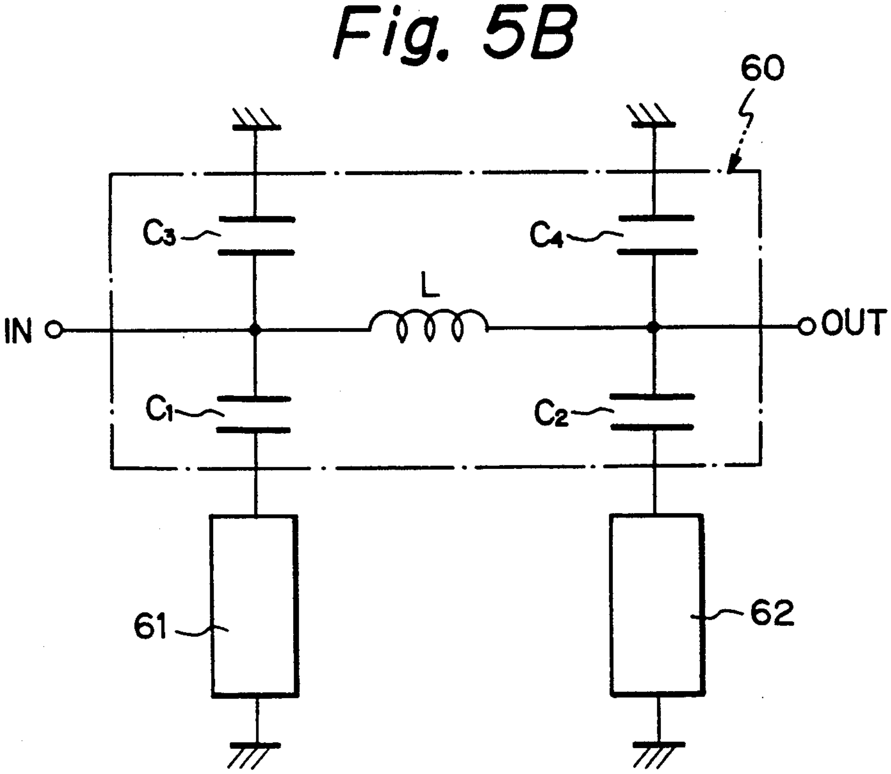
Figure 6:
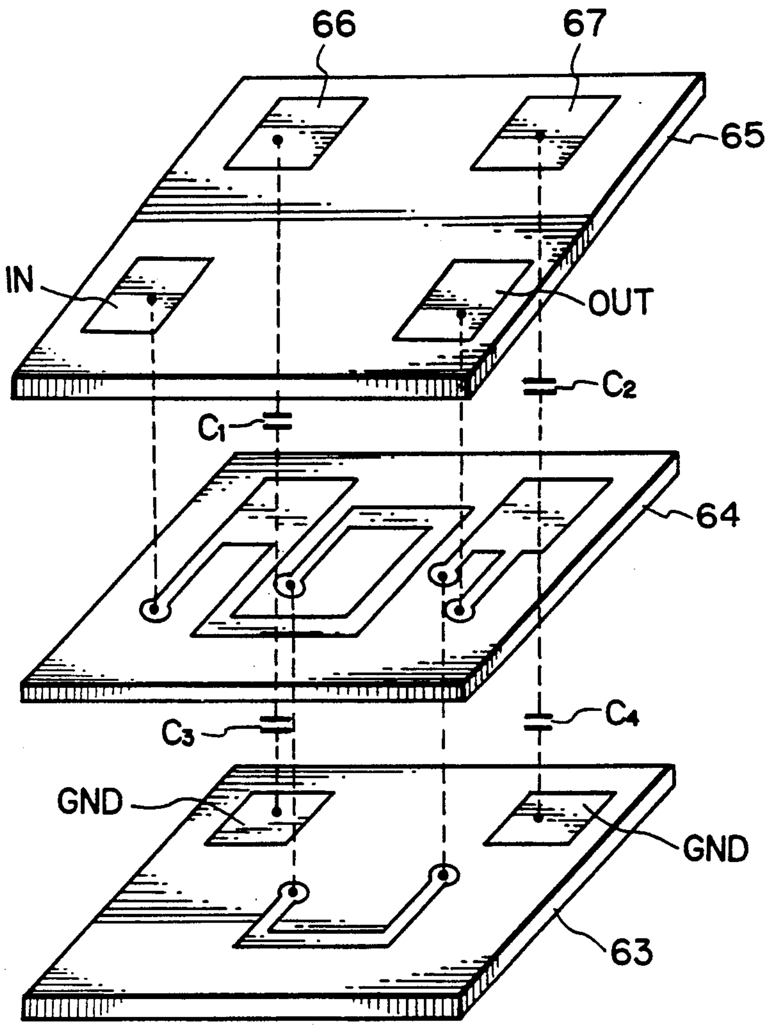
FIG. 6 is an exploded view in perspective of an interstage circuit board of the dielectric filter shown in FIG. 5A.
Figure 7:
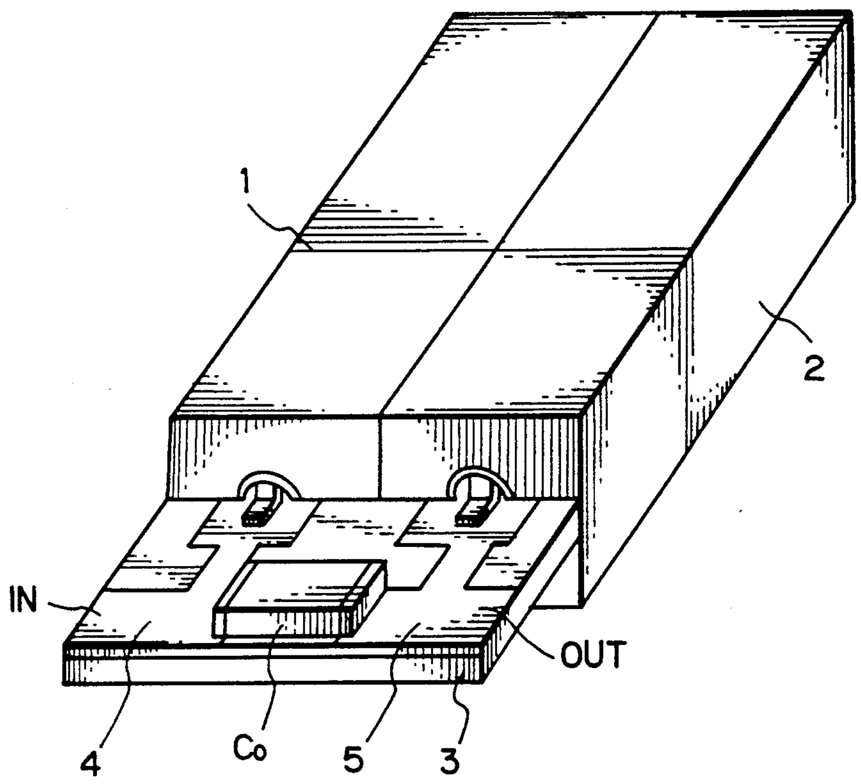
Fig. 7 PRIOR ART
FIG. 7 is a perspective view (of the main body only) of a dielectric filter as a first prior-art example.
Figure 8:
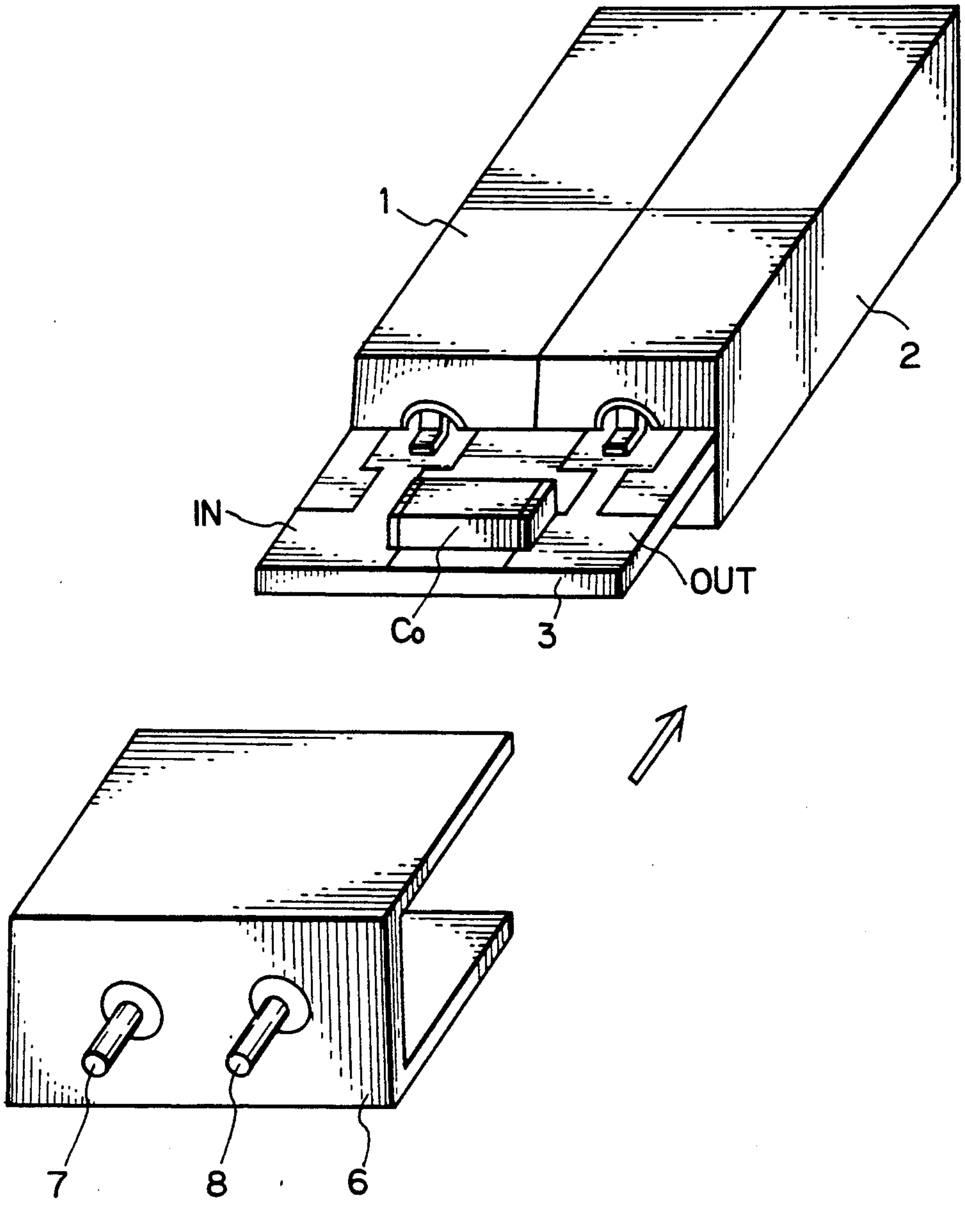
Fig. 8 PRIOR ART
FIG. 8 is a perspective view (of the main body and the metal case) of the dielectric filter of the first prior-art example.

FIGS. 5A, 5B, and 6 are diagrams showing a dielectric filter according to a third embodiment, in which FIG. 5A is a perspective view of the dielectric filter, FIG. 5B is a circuit diagram of the dielectric filter, and FIG. 6 is an exploded view in perspective of the interstage circuit board. In those figures, reference numeral 60 denotes the interstage circuit board (multi-layer circuit board), 61 and 62 dielectric resonators, 63 to 65 layers (dielectric layers) of the interstage circuit board 60, 66 and 67 soldering pads (electrodes for mounting the resonators), $C_1$ to $C_4$ capacitors, L a coil, IN an input terminal, OUT an output terminal, and GND a ground electrode.

The dielectric filter shown in FIGS. 5A and 5B is formed by arranging the dielectric resonators 61 and 62 such that they contact with each other at one side face thereof, and by attaching the interstage circuit board 60 constituted by a multi-layer circuit board to one end in the longitudinal direction of the dielectric resonators 61 and 62. As shown in FIG. 6, this interstage circuit board 60 has the interstage circuit, shown in FIG. 5, configured by containing a helical coil L and capacitors $C_1$ to $C_4$, made by thick film patterns (thick film printed patterns), between the layers 63, 64 and 65.

The connection between the interstage circuit board 60 and the dielectric resonators 61 and 62 is done by soldering the terminals inserted in the dielectric resonators 61 and 62 to the interstage circuit board (multi-layer circuit board) 60 as shown in FIG. 5A. Soldering pads (electrodes for mounting the resonators) 66 and 67 are previously formed on the surface of the circuit board 60, which pads are connected with the internal circuit. Various changes and variations are possible in the number of dielectric resonators to be connected and in the arrangement of L and C.

As shown in FIG. 5A, since the interstage circuit board 60 is much smaller in size than that of the dielectric resonators 61 and 62, the soldering pads 66 and 67 formed on the circuit board for soldering the dielectric resonators 61 and 62 to the interstage circuit board 60 become a significant space factor in the area of the circuit board 60. Therefore, as shown in FIG. 6, the capacitors $C_1$ to $C_4$ will be formed just below the soldering pads 66 and 67 (just below means at the positions facing the soldering pads 66 and 67 in the laminated direction), allowing the interstage circuit board 60 to be miniaturized. This arrangement eliminates redundant stretching around of wires, thereby reducing the occurrence of unnecessary inductances produced by connection of the capacitors $C_1$ to $C_4$.

Filter characteristics of the dielectric resonators in which the interstage circuit includes a coil L as shown in FIG. 5B is governed by Q of the coil L. More specifically, if Q of the coil L is low, the steepness of the band pass characteristics is loosened. In order to design the interstage circuit to maintain Q of the coil L so as to not be reduced, it is necessary to perform patterning of the coil in a helical form without overlapping any other electrode pattern. Therefore, in this embodiment, the coil L is arranged in a helical form between the soldering pads 66 and 67 so that any electrode pattern does not overlap any part of the coil, as shown in FIG. 6. More specifically, the electrodes of the capacitors $C_1$ to $C_4$ should preferably be located respectively under the soldering pads 66 and 67, and also the coil L should preferably be located under the gap between the soldering pads 66 and 67. By this arrangement, the interstage circuit board 60 can be made small in size and the coil with a high Q can be obtained. In addition, if the dielectric filter is made by a plurality of interstage circuit boards in a multi-stage structure, patterns of coils L of the respective circuit boards are arranged with interposition of the soldering pads 66 and 67, so that the coupling of the coils L can be reduced by the soldering pads 66 and 67.

The way of connecting and fixing the multi-layer circuit board and the dielectric resonators is not limited to that shown in FIG. 5A, but as in the first embodiment, the main surface of the multi-layer circuit board can be positioned to face to one end in the longitudinal direction of the dielectric resonators.

In general, for the substrate of the circuit board (interstage circuit board) in which a thick film inductor element and thick film capacitor elements are formed as mentioned above, material having a high dielectric constant is used to obtain a higher Q of the capacitor elements. However, when an inductive conductor (coil) is patterned on the circuit board having a high dielectric constant, the wavelength varies to be shortened depending upon the dielectric constant of the circuit board near the conductor. Also, a stray capacitance which is ascribable to the coil pattern increases, so that the self-resonance frequency becomes relatively low, causing that the coil pattern does not function as an inductor in the high frequency range. Furthermore, between the conductor of the inductance part and the conductors near the inductance part is produced a stray capacitance based on the dielectric constant of the circuit board, so that a desired frequency characteristic cannot be obtained.

However, according to this embodiment, in the interstage circuit board having at least a thick film coil pattern and thick film capacitor electrode patterns, each board layer (dielectric layer) is formed by a low-temperature-baking ceramic material, in which the dielectric constant $\epsilon_1$ of each the circuit board (the dielectric layers) is made 15 or less, preferably 10 or less.

The reason why the dielectric constant $\epsilon_1$ of the dielectric layers near where the thick film coil pattern is to be formed is made 15 or less, preferably 10 or less is described below.

To prevent the inductance part from being affected by the signal wavelength, the length of the conductor constituting the coil pattern must be made about ¼ or less of the wavelength, preferably about 1/10 or less. However, the wavelength is shortened depending on the dielectric constant of the part of the circuit board near the conductor constituting the coil pattern. Thus, when a circuit board substrate having a high dielectric constant is used, the inductance part cannot be prevented from being affected by the signal wavelength unless the conductor length is substantially decreased. However, if the conductor length is too short, a necessary number of turns of coil cannot be obtained.

However, if a circuit board substrate having a low dielectric constant is used, the inductance part is prevented from being affected by the signal wavelength without shortening the conductor length so much, and therefore, the formation of the coil pattern is made easy. In a band up to about 1 GHz, for example, the inductance value of the coil need not be so high (e.g., about 30 nH or less). Therefore, in this embodiment, the upper limit of the above-mentioned dielectric constant $\epsilon_1$ is set at 15.

In case an interstage circuit board substrate having a dielectric constant $\epsilon_1$ of 15 or less is used, the stray capacitances between the conductors of the coil are reduced, and thus the self-resonance frequency of the coil can be set on the higher frequency side than a working frequency, so that excellent frequency characteristics can be obtained in the working frequency.

As a result, in the multi-layer circuit board in which a thick film coil pattern and thick film capacitor electrode patterns are provided, the dielectric layers near the thick film coil pattern are set at a dielectric constant ($\epsilon_1$) in the range mentioned above, according to the present invention.

If it is possible that the dielectric layer near the thick film coil pattern and the dielectric layer between the thick film capacitor electrode patterns are constituted by materials having different dielectric constants with each other, the dielectric constant $\epsilon_2$ of the dielectric layer between the thick film capacitor electrode patterns should preferably be set at a higher value than the dielectric constant $\epsilon_1$ of the dielectric layer near the thick film coil pattern ($\epsilon_2 > \epsilon_1$).

There are no limitations on component materials of the substrate of the interstage circuit board (multi-layer circuit board), but to achieve the dielectric constant and to make the circuit board by baking at low temperature as described later, the interstage circuit board substrate should preferably be formed from a composite structural material including a ceramic aggregate and glass.

The glass content in the substrate should be 50 percent by volume or more, preferably 60 to 70 percent by volume. If the glass content is lower than the above-mentioned range, it is difficult for the circuit board substrate to be formed in a composite structure, its strength and formability are low, and furthermore, it is difficult to perform low-temperature baking (described later).

There are no special limitations on ceramic aggregates, and it is only necessary to suitably select one kind or more of alumina, magnesia, spinel, mullite, forsterite, steatite, cordierite, and zirconia, for example, according to a target dielectric constant, baking temperature, etc.

Also, there are no limitations on glass, and the following kinds of glass may be utilized: boro-silicate glass, lead boro-silicate glass, boro-silicate barium glass, boro-silicate calcium glass, boro-silicate strontium glass, and boro-silicate zinc glass, which are generally used as glass frit. Lead boro-silicate glass and boro-silicate strontium glass are especially suitable.

The glass composition is preferably as follows:

$SiO_2$: 50 to 60% wt
$Al_2O_3$: 5 to 15% wt
$B_2O_3$: 8 wt. % or less
one to four kinds of CaO, SrO, BaO and MgO: 15 to 40% wt
PbO: 30% wt or less The above-mentioned chemical composition may contain 5% wt or less of one or more kinds selected from $Bi_2O_3$, $TiO_2$, $ZrO_2$, and $Y_2O_3$.

The circuit board substrate materials including the ceramic aggregates and glass as mentioned above can be baked at low temperature, and can be subjected to a simultaneous baking with the coil conductor and capacitor electrodes of Ag or Ag—Pd alloy.

There are no special limitations on the coil conductor material and the capacitor electrode material. According to this embodiment, low-resistance conductive materials which need to be baked at a temperature of about 1000° C. or below, such as Au, Ag, Pd, Ag—Pd, Cu and Pt can be used. Among the low-resistance conductive materials, one containing 95 to 100% wt of Ag or Cu is suitable.

Also, there are no special limitations on the shape of the coil conductor pattern. For example, the conductor pattern may be either in a spiral or helical form. The coil inductance can be set at a desired value depending upon the number of turns and the opening area of the coil.

Furthermore, there are no limitations on the capacitor electrode pattern, and the shape of the pattern may be selected at discretion to suit the object. The capacitances of the capacitors can be set at desired values depending upon the electrode area, the electrode gap distance, the number of laminated electrode layers, and the dielectric constant of the circuit board substrate.

Although there are no special limitations on the manufacturing method of the above-mentioned interstage circuit board, it is preferable to utilize a green sheet method.

In the green sheet method, first of all, green sheets are manufactured which are used as circuit board substrate. The aforementioned substrate material, that is, ceramic aggregate particles and glass frit are mixed. Then, adding a vehicle including a binder, a solvent, etc., they are kneaded into a paste (slurry). Using this paste, a specified number of green sheets each preferably about 0.1 to 1.0 mm thick are manufactured by a doctor blade method or an extrusion method, for example. Preferably, the particle diameter of glass is about 0.1 to 5 μm, and the diameter of ceramic aggregate particles is about 1 to 8 μm.

The vehicle can be selected from among a binder such as ethyl cellulose, polyvinyl butyral, or an acrylic resin like a methacrylic resin and butyl methacrylate, a solvent such as ethyl cellulose, terpioneol and butyl carbitol, and other materials such as a dispersant, an activator, a plasticizer, etc.

Then, using a punching machine or a die press, through-holes are formed in the green sheets as required. After this, a conductor paste is printed on each green sheet to a thickness of about 10 to 30 μm by screen printing process, for example, by which a coil conductor and capacitor electrode patterns are formed. At the same time, the through-holes are filled with this conductor paste.

Preferably, this conductor paste is manufactured by mixing conductive particles and a glass frit mentioned above, and adding similar vehicles as mentioned above, and kneading the mixture into a slurry state. The content of the conductive particles is preferably about 80 to 95% wt. The average particle diameter is preferably about 0.01 to 5 μm. After baking, the thickness of the conductor and electrodes is normally about 5 to 20 μm.

Next, the green sheets are stacked and undergo a heat press process at a temperature of about 40° to 120° C. and at a pressure of about 50 to 1000 kgf/cm$^2$, by which a laminated body of green sheets is formed. Then, the laminated body undergoes processes of binder removal, cutting groove formation, etc.

Subsequently, the laminated body of green sheets on which conductor and electrode patterns have been formed by a conductor paste are baked together under the conditions as follows. The baking temperature is 1000° C. or below, preferably about 800° to 1000° C., or more preferably about 850° to 900° C. The baking time is about one to three hours, and the maximum temperature is preferably maintained for about 10 to 15 min. As the baking environment, air, $O_2$ or an inert gas such as $N_2$ can be used. The air is most preferred in terms of the ease of use and low cost. However, when Cu is used as a conductive material, baking should preferably be performed in an inert gas.

When an external conductor is to be formed on the laminated circuit board, normally, after the laminated circuit board is baked, a paste for the external conductor is printed and baked, but the external conductor and the laminated circuit board can be baked simultaneously.

Similarly the baking of the conductor paste on the green sheets should preferably be carried out simultaneously with the baking of the green sheets. However, another possible method is that after the circuit-board green sheets have been baked, a conductor paste is printed or arranged on the circuit board, and baked.

The materials and manufacturing method, etc. of the multi-layer circuit board described above apply similarly to the first and second embodiments.

According to the third embodiment, the following additional advantages can be obtained.

(A) In an interstage circuit board containing a thick film coil pattern and thick film capacitor electrode patterns, the dielectric constant $\epsilon_1$ of the part of the circuit board substrate close to the thick film coil pattern is set at 15 or less, preferably 10 or less. Therefore, the self-resonance frequency at the inductor part is less shifted to a low frequency band, so that the dielectric filter can be used in a high frequency band, causing a compact-size high frequency filter to be formed. It is true that such a filter can be designed and manufactured easily.

(B) The use of a circuit board substrate having a low dielectric constant suppresses the occurrence of stray capacitance between the inductor part and conductors nearby, thus making it possible to obtain excellent frequency characteristics.

(C) The interstage circuit can suppress self-resonance of the coil and any influence from the wavelength, so that the function of the coil can be exhibited effectively.

(D) The substrate of the interstage circuit board is made by a low-temperature-baking material which can be baked at a temperature of 1000° C., which makes it possible to use Ag, Cu or the like, which have a low resistance as conductor materials. Therefore, it is possible to reduce the increase in resistance or the decrease in Q resulting from the skin effect, which is a problem in when using a high frequency band.

(E) The dielectric filter according to this embodiment is suitable for use in a high frequency band of about 100 MHz or more, and can be applied to a frequency band from about 300 MHz to 1 GHz. In addition good filter characteristics can be obtained.

Industrial Applicability

The present invention can be applied to various types of radio equipment, such as portable telephones and automobile telephones and also to other types of communication and electronic equipment.

I claim:

1. A dielectric filter, comprising:

a plurality of dielectric resonators;

a multi-layered circuit board operatively connected to said plurality of dielectric resonators, said circuit board including at least first and second dielectric substrate layers;

a first capacitor electrode pattern formed on a top outer surface of the first substrate layer and having at least one top capacitor electrode;

a second capacitor electrode pattern formed on a top inner surface of the second substrate layer and having at least one bottom capacitor electrode; and a connector pattern formed on a bottom outer surface of the second substrate layer so as to operatively connect said circuit board to said plurality of dielectric resonators, said connector pattern having at least corresponding resonator connector electrodes formed therein, said first and second capacitor electrode patterns and said connector pattern being operatively connected to each other via a plurality of blind through-hole electrodes formed in the first and second substrate layers of said circuit board, both ends of each of said through-hole electrodes being connected to at least one of said first and second capacitor electrode patterns and said connector pattern.

2. A dielectric filter as claimed in claim 1, wherein said connector pattern has an input electrode and an output electrode.

3. A dielectric filter as claimed in claim 1, wherein said first capacitor electrode pattern is formed so as to incorporate means for adjustably trimming the top capacitor electrodes formed in said first capacitor electrode pattern.

4. A dielectric filter as claimed in claim 1, wherein said multi-layered circuit board is formed from a ceramic material.

5. A dielectric filter as claimed in claim 1, wherein each of said plurality of dielectric resonators has an internal conductor strip with a dielectric member with a length of substantially ¼ of a predetermined wavelength surrounding the internal conductor strip, a first end of the internal conductor strip being shorted to an external conductor and a second end of the internal conductor strip being open, and said multi-layered circuit board being operatively connected to the open second ends of said plurality of resonators.

6. A dielectric filter, comprising:

a plurality of dielectric resonators, each having an internal conductor strip with a dielectric member with a length of substantially ¼ of a predetermined wavelength surrounding the internal conductor strip, a first end of the internal conductor strip being shorted to an external conductor and a second end of the internal conductor strip being open;

a multi-layered circuit board operatively connected to the open second ends of said plurality of resonators, said circuit board including at least first and second dielectric substrate layers;

a first capacitor electrode pattern formed on a top outer surface of the first substrate layer and having at least one top capacitor electrode, said first capacitor electrode pattern being formed so as to incorporate means for adjustably trimming the top capacitor electrodes formed in said pattern;

a second capacitor electrode pattern formed on a top inner surface of the second substrate layer and having at least one bottom capacitor electrode; and a connector pattern formed on a bottom outer surface of the second substrate layer so as to operatively connect said circuit board to said plurality of dielectric resonators, said connector pattern having at least corresponding resonator connector electrodes formed therein, said first and second capacitor electrode patterns and said connector pattern being operatively connected to each other via a plurality of blind through-hole electrodes formed in the first and second substrate layers of said circuit board, both ends of each of said through-hole electrodes being connected to at least one of said first and second capacitor electrode patterns and said connector pattern.

7. A dielectric filter, comprising:

a plurality of dielectric resonators;

a multi-layered circuit board operatively connected to said plurality of dielectric resonators, said circuit board including at least first, second and third dielectric substrate layers;

a first capacitor electrode pattern formed on a top outer surface of the first substrate layer so as to operatively connect said circuit board to said plurality of dielectric resonators, said pattern having formed therein an input electrode, an output electrode and top capacitor electrodes corresponding to each of the plurality of dielectric resonators;

a second capacitor electrode pattern formed on a top inner surface of the third substrate layer and having bottom capacitor electrodes formed therein;

a third capacitor electrode pattern formed on a top inner surface of the second substrate layer and having center capacitor electrodes formed therein so as to form corresponding capacitors between the first and third capacitor electrode patterns, and between the second and third capacitor electrode patterns; and a coil pattern formed through the first, second and third substrate layers, said first, second and third capacitor electrode patterns and said coil pattern being operatively connected to each other via a plurality of blind through-hole electrodes formed in the first, second and third substrate layers of said circuit board, both ends of each of said through-hole electrodes being connected to at least one of said first and third capacitor electrode patterns and said coil pattern.

8. A dielectric filter as claimed in claim 7, wherein said first capacitor electrode pattern being formed so as to incorporate means for adjustably trimming the top capacitor electrodes formed in said first capacitor electrode pattern.

9. A dielectric filter as claimed in claim 7, wherein said multi-layered circuit board is formed from a ceramic material with a dielectric constant of 15 or less.

10. A dielectric filter as claimed in claim 7, wherein each of said plurality of dielectric resonators has an internal conductor strip with a dielectric member with a length of substantially ¼ of a predetermined wavelength surrounding the internal conductor strip, a first end of the internal conductor strip being shorted to an external conductor and a second end of the internal conductor strip being open, and said multi-layered circuit board being operatively connected to the open second ends of said plurality of resonators.

11. A dielectric filter, comprising:

a plurality of dielectric resonators, each having an internal conductor strip with a dielectric member with a length of substantially ¼ of a predetermined wavelength surrounding the internal conductor strip, a first end of the internal conductor strip being shorted to an external conductor and a second end of the internal conductor strip being open;

a multi-layered circuit board operatively connected to the open second ends of said plurality of resonators, said circuit board including at least first, second and third dielectric substrate layers;

a first capacitor electrode pattern formed on a top outer surface of the first substrate layer so as to operatively connect said circuit board to said plurality of dielectric resonators, said pattern having formed therein an input electrode, an output electrode and top capacitor electrodes corresponding to each of the plurality of dielectric resonators, said first capacitor electrode pattern being formed so as to incorporate means for adjustably trimming the top capacitor electrodes formed in said pattern;

a second capacitor electrode pattern formed on a top inner surface of the third substrate layer and having bottom capacitor electrodes formed therein;

a third capacitor electrode pattern formed on a top inner surface of the second substrate layer and having center capacitor electrodes formed therein so as to form corresponding capacitors between the first and third capacitor electrode patterns, and between the second and third capacitor electrode patterns; and a coil pattern formed through the first, second and third substrate layers, said first, second and third capacitor electrode patterns and said coil pattern being operatively connected to each other via a plurality of blind through-hole electrodes formed in the first, second and third substrate layers of said circuit board, both ends of each of said through-hole electrodes being connected to at least one of said first and third capacitor electrode patterns and said coil pattern.

* * * * *